United States Patent [19]

Aida et al.

[11] Patent Number: 4,593,276

[45] Date of Patent: Jun. 3, 1986

[54] OVERCURRENT DISPLAY DEVICE

[75] Inventors: Mitsuo Aida, Komaki; Mitsuharu Kudomi, Konan; Toshiyuki Adachi, Kakamigahara, all of Japan

[73] Assignee: Takamatsu Electric Works, Ltd., Aichi, Japan

[21] Appl. No.: 452,349

[22] Filed: Dec. 22, 1982

[30] Foreign Application Priority Data

Dec. 29, 1981 [JP] Japan ................................ 56-215887

[51] Int. Cl.4 ...................... G08B 21/00; G01R 19/15
[52] U.S. Cl. .................................... 340/664; 324/127; 324/133; 340/691; 340/815.24; 361/100; 361/118
[58] Field of Search ............... 340/664, 530, 595, 693, 340/815.24, 815.1, 691; 324/133, 127; 361/118, 110; 73/762; 116/212

[56] References Cited

U.S. PATENT DOCUMENTS

| | | | |
|---|---|---|---|
| 699,140 | 5/1902 | Blake | 340/815.24 |
| 2,449,304 | 9/1948 | Lamb | 340/595 X |
| 3,602,186 | 8/1971 | Popenoe | 116/212 X |
| 3,771,049 | 11/1973 | Piccione | 340/664 X |
| 3,775,675 | 11/1973 | Freeze et al. | 340/664 X |
| 3,813,664 | 5/1974 | Geyer | 340/530 X |
| 3,943,427 | 3/1976 | Tolstov et al. | 361/118 X |
| 3,988,649 | 10/1976 | Mentler | 340/664 X |
| 3,991,366 | 11/1976 | Schweitzer, Jr. | 340/664 X |
| 4,223,365 | 9/1980 | Moran | 340/664 X |
| 4,358,810 | 11/1982 | Wafer et al. | 340/664 X |
| 4,378,525 | 3/1983 | Burdick | 324/127 |
| 4,406,985 | 9/1983 | Phillips et al. | 324/133 X |
| 4,408,175 | 10/1983 | Nelson et al. | 324/127 X |
| 4,414,543 | 11/1983 | Schweitzer, Jr. | 340/664 X |

Primary Examiner—Glen R. Swann, III
Assistant Examiner—Thomas J. Mullen, Jr.
Attorney, Agent, or Firm—Jordan and Hamburg

[57] ABSTRACT

An overcurrent display device is described which is suspended directly from a distribution cable for locating the spots of earthing, short-circuiting or other accidents in a distribution line system and is adapted to display the passage of the transient overcurrent due to such accidents through the cable for a predetermined time and to be restored to the original state before the display of the overcurrent condition. The device consists of an overcurrent sensing circuit, a drive unit including a drive element driven by the sensing circuit and a display unit actuated by the drive unit and adapted to achieve a display operation.

14 Claims, 14 Drawing Figures

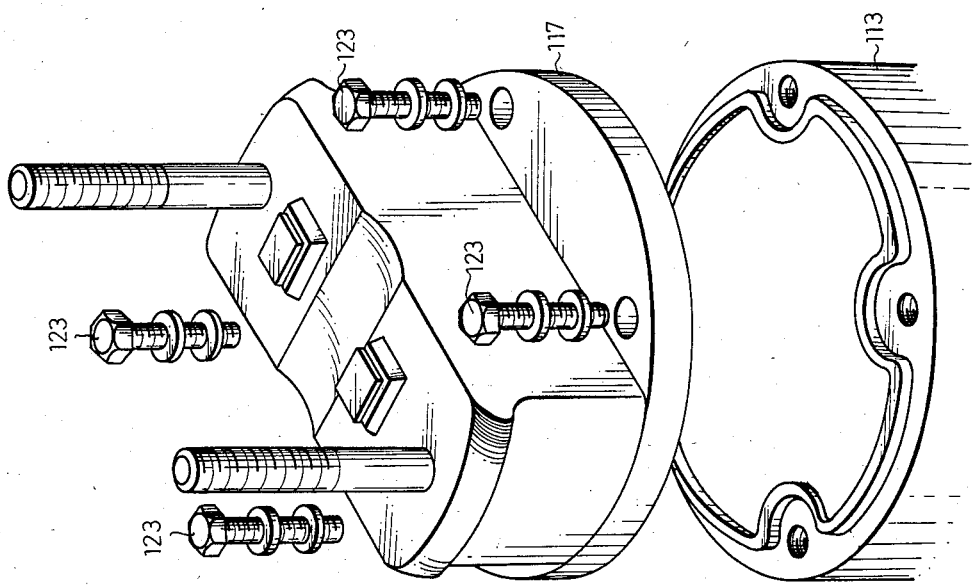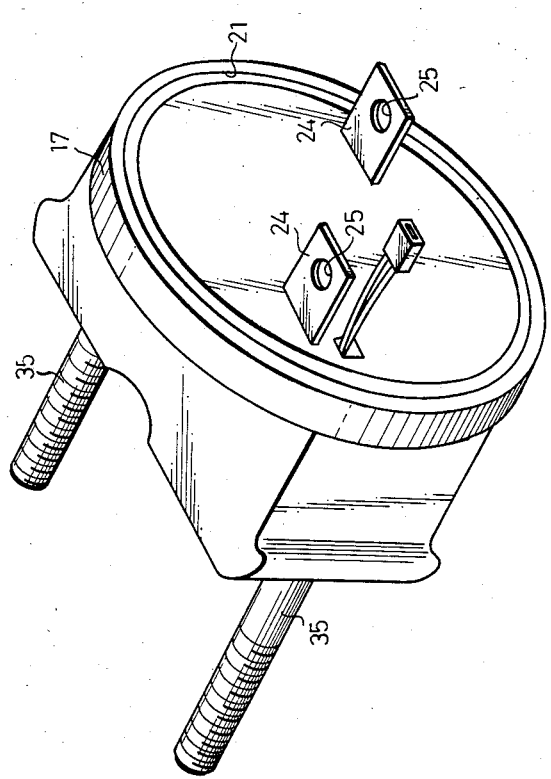

OVERCURRENT DISPLAY DEVICE

FIELD OF THE INVENTION

This invention relates to an overcurrent display device suspended directly from a distribution cable for locating the spots of earthing, short-circuiting or other accidents in a distribution line system and adapted to display the passage of the transient overcurrent in the cable due to such accidents for a predetermined time after accidents, the device is restored automatically to the original state before the display of the overcurrent condition.

BACKGROUND OF THE INVENTION

An overcurrent display device of this type detects an overcurrent selectively and a display member of the device is actuated mechanically. The electric power necessary for actuating the device and controlling circuit associated therewith is taken from a distribution cable through a current transformer. The electric power obtained in this manner is restricted generally in magnitude and it is rather difficult to provide a reliable display of the overcurrent condition with this electric power.

On the other hand, when a current transformer, i.e. a principal member to sense an overcurrent, is replaced by another transformer of different output property, trouble arises in adjusting the sensing and controlling circuit to operate satisfactorily. In some cases, misoperations of the overcurrent display device cannot be prevented.

Furthermore, the overcurrent display device must be suspended directly from a cable for a long time without maintenance. Consequently the magnetic properties of the current transformer must be stable over the long time, and the whole device must be compact, duarable and lightweight. The device needs waterproof and rust prevention.

OBJECTS OF THE INVENTION

It is an object of the present invention to provide an overcurrent display device wherein an overcurrent sensing circuit can be connected interchangeably with various current transformers of different output properties, i.e. with current transformers of large output current as well as of small output current.

It is another object of the present invention to provide an overcurrent display device wherein a sufficient operating current is supplied to a drive unit actuating in turn a display unit of the display device when an overcurrent flows in the cable.

It is still another object of the present invention to provide an overcurrent display device wherein a main casing and a lower core case bearing the total weight of the main casing including a drive unit and a display unit both enclosed by are improved in durability.

It is still another object of the present invention to provide an overcurrent display device wherein the main casing can be set to the lower core case with reinforcement and sealing of the contacting zone between both members is improved.

It is still another object of the present invention to provide an overcurrent display device wherein the abutting zone between a lower end portion of the upper core as exposed towards downward from the upper core case and an upper end portion of the lower core exposed upwards from the lower core case may be safeguarded against the intrusion from outside of rainwater and fine dust.

It is still another object of the present invention to provide an overcurrent display device wherein the cable can be clamped between the upper and lower cores under a moderate pressure.

It is still another object of the present invention to provide an overcurrent display device wherein some oil is stored in an oil storage space provided at the outer periphery of the abutting portions of the upper and lower cores of the current transformer to prevent the cores from rusting surely.

It is still another object of the present invention to provide an overcurrent display device wherein the upper and lower cores may be prevented from being crushed even if each of said cores is subjected to an impact during the molding process of the upper and lower core cases and wherein the cores may be positioned correctly within the respective core cases.

The other objects of the invention will become more apparent from the perusal of the following description of the preferred embodiments thereof and the appended claims. Those skilled in the art will recognize many advantages not mentioned herein when they practice the present invention.

BRIEF DESCRIPTION OF THE DRAWINGS

FIG. 7 is a perspective view showing the bottom surface of the lower core case, FIG. 9 is a partial perspective view showing the mounting relation between a main casing and a lower core case in a conventional overcurrent display device.

DESCRIPTION OF THE PREFERRED EMBODIMENTS

An overcurrent display device according to the present invention comprises an overcurrent sensing circuit, a drive unit and a display unit.

Reference is made first to FIGS. 1 through 8 for illustrating the constructional details of a preferred embodiment of the present invention.

Figure 2:
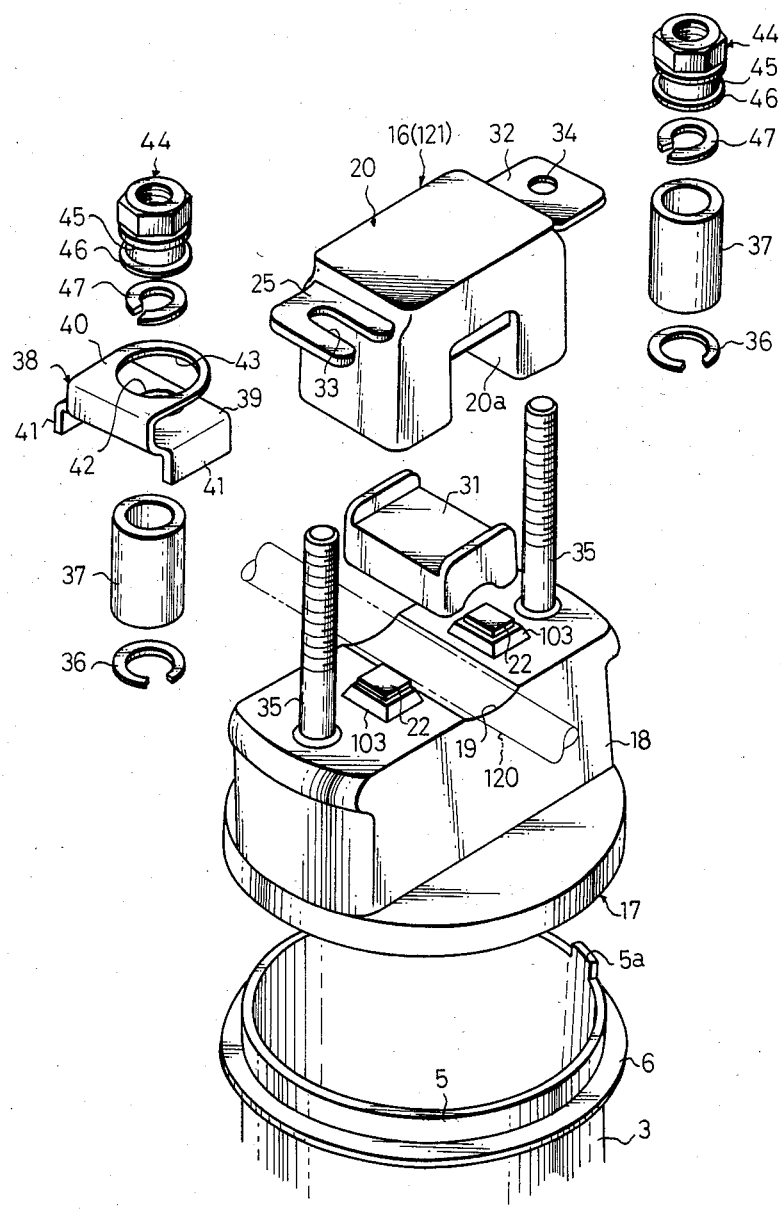
FIG. 2 is an exploded perspective view showing the cable clamp of the display device.

A base block 1 formed of synthetic material is provided with an engaging groove 2 formed over the full outer periphery of the base block. A cylindrical cover 3 is formed of synthetic material and is mounted on said base block 1 with a lower peripheral engaging rib 4 formed at the lower periphery thereof being received in said engaging groove 2, the base block 1 and the cover 3 conjointly forming a main casing of the device. The upper peripheral edge of the cover 3 is formed with an upwardly extending rib 5 and a transversely extending flange 6. A rotation lock projection 5a is formed on a portion of the upper edge of the rib 5 as shown in FIG. 2.

A display unit 7 includes a display tube 8 having its lower periphery threadedly attached to the base block 1. A colored fluid 101 and a transparent fluid 102 of specific gravity higher than that of the colored fluid 101 are stored in the display tube 8 to form of an upper layer and a lower layer respectively. A display valve 9 is disposed in the fluids 101 and 102. An O-ring 11 is interposed between a clamp flange 10 formed on the lower outer periphery of the display tube 8 and the upper surface of the base block 1.

In the display unit 7, the display valve 9 suspended by a string member 14 is raised by a drive unit 12, which is to be described later, to the upper zone within the display tube 8 while pushing aside the colored fluid 101 when the drive unit 12 is actuated by the electromagnetic force due to a sensed overcurrent.

Overcurrent conditions can be checked by observing the colored fluid 101 from below the display tube 8 through the transparent fluid 102 as the colored fluid 101 is displaced towards below the display valve 8. Such display of the overcurrent conditions continues for a predetermined time, usually for 3 to 7 hours, until the display valve 9 is lowered spontaneously from its uppermost position to the lowermost level of the colored fluid 101 against the viscosity of the colored fluid 101. The display valve 9 is stopped with the lower surface thereof being slightly immersed in the upper level of the transparent fluid 102 when the weight of the valve is balanced exactly by buoyancy acting on the valve. Hence, only the transparent fluid 102 remains below the display valve 9, indicating the normal display state of the device.

Figure 8:
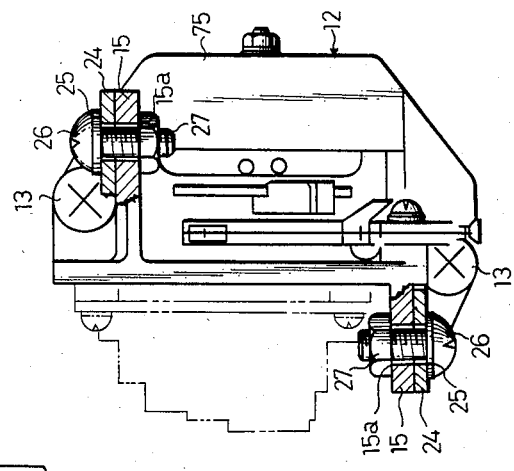
FIG. 8 is a plan view, with part broken away, showing the mounting relation between a drive unit and a display unit.

A drive unit 12 is placed on the display tube 8 in the upper region inside the cover 3 and is threadedly mounted on the upper surface of the display tube 8 by a pair of screws 13. The drive unit 12 comprises a rotary solenoid 75 and a mechanism to be driven by the torque of the rotary solenoid 75. Each of a pair of mounting plates 15 has a mounting hole 15a as shown in FIG. 8. When an overcurrent is sensed by a current transformer 121 to be described later in detail, the rotary solenoid 75 is energized by the sensed overcurrent. The mechanism in the drive unit 12, in turn, is actuated by the rotary solenoid 75 and exerts an upward pulling force on the display valve 9 through the string member 14. In this manner, the drive unit 12 cooperates with the display unit 7 to establish the display of the overcurrent conditions.

Figure 3:
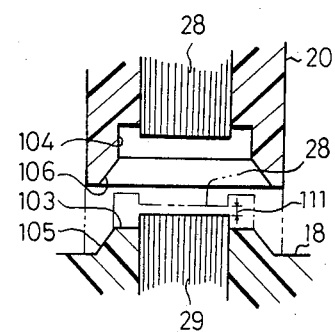
FIG. 3 is an enlarged partial section showing abutment portions of the upper and lower core cases of the display device.
Figure 6:
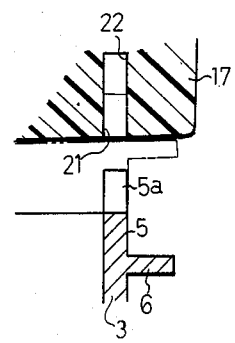
FIG. 6 is a partial section showing the mounting relation between the main casing to the lower core case.
Figure 5:
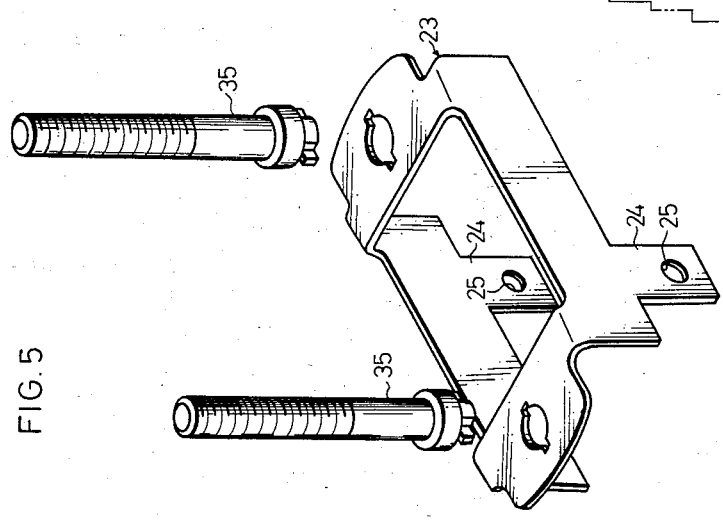
FIG. 5 is an enlarged exploded perspective view showing the mounting relation between a base plate in the lower core case and screw rods mounted to the base plate.

Now, the description is made about a current transformer enclosed inside a cable clamp. A lower core case 17 is secured to the upper surface of the main casing and is formed of a resilient insulating material such as weatherproof rubber and the like. A mounting portion 18 is integrally formed with the lower core case 17 and extends upward from the upper surface of the lower core case 17. A recess 19 of a semi-cylindrical form is defined centrally of the upper surface of the mounting portion 18. An upper core case 20 is removably mounted on the upper surface of the mounting portion 18 so as to overlie the recess 19 and is formed similarly of a resilient insulating material such as a weatherproof rubber and the like. An annular groove 21 is formed on the lower surface of the lower core case 17 as shown in FIG. 7. A rotation lock recess 22 is formed contiguous to the inner bottom of the recess 21. The lower core case 17 is mounted on the flange 6 of the cover 3 to prevent rotation relative to the cover 3 with the rib 5 of the cover 3 received in the groove 21 and with the rotation lock projection 5a of the rib 5 received in the rotation lock recess 22 of the groove 21. A base plate 23 is embedded in the lower core case 17 and has a pair of mounting tabs 24 on both sides thereof as shown in FIG. 5. Each of said mounting tabs 24 has a mounting hole 25 and is partly extending downwardly from the lower surface of the lower core case 17 as shown in FIG. 7. These mounting tabs 24 are placed on the mounting plate 15 of the drive unit 12 and secured to said mounting plate 15 by means of nuts 27 and mounting screws 26 passed through the mounting holes 25 and 15a. An upper core 28 of an inverted U shape is molded integrally with the upper core case 20. The upper core is made of magnetizable material and has its lower end portion exposed in recesses 104 formed on the lower end surfaces of the upper core case 20. An inclined abutting surface 106 is formed on the annular periphery of the recess 104. A lower core 29 of a U shape is molded integrally with the lower core case 17. The lower core 29 is made of magnetizable material and has its upper end portions exposed from bosses 103 formed on the upper surface of the mounting portion 18 of the core case 17 to about the exposed lower end portion of the upper core 28. An inclined abutting surface 105 designed to fit the abutting surface 106 of the recess 104 is formed around each boss 103 as shown in FIG. 3. When the abutting surface 105 fits the surface 106 of the upper core case 20, a gap 111 shown in FIG. 3 is defined between the exposed lower end of the upper core 28 and the exposed upper portion of the lower core 29. This gap 111 serves as an interspace which is reduced to zero when the upper and lower cores 28 and 29 are brought into contact with each other by further pressuring the surface 105 to the surface 106. In this manner, the magnetic circuit for a sensing current transformer is formed by the upper and lower cores 28 and 29. A coil 30 is wound around the lower core 29 and forms a sensing current transformer 121 together with the cores.

A clamp member 31 is formed of a resilient material such as a rubber and the like and is removably attached to a mounting recess 20a at the center of the lower surface of the core case 20. The clamp member 31 and the recess 19 on the mounting member 18 make up a wire clamp section 16 for clamping and enclosing the cable 120 between the upper and lower cores 28 and 29.

A holding plate 32 is embedded in the upper core case 20 and has its extreme portions extending from both side portions of the upper core case 20. A slot 33 is made in one extreme end of the plate 32, and a circular through-hole 34 is bored in the other extreme end of the plate 32. Each of a pair of screw rods 35 is secured at its base end to the core case 17 and is extending upwards therefrom through both sides of the upper surface of the mounting member 18. Each screw rod 35 has its base end caulked to both sides of the base plate 23 embedded, in turn, in the lower core case 17. A C-shaped washer 36 is passed through by the screw rod 35 and rests on the upper surface of the mounting member 18. A collar 37 is also passed through by the screw rod 35 and rests on the washer 36. The holding plate 32 is placed on the collar 37 after the screw rods 35 are inserted in the slot 33 and the through-hole 34.

An extrication lock member 38 is formed of an extrication lock plate 39 adapted to rest on the end portion of the plate 32 at the side of the slot 33 and an L-shaped seat plate 40 integrally formed with the extrication lock plate 39. The member 38 has closing portions 41 made by turning down both edges of the extrication lock plate 39 adapted to engage with both sides of the plate 32, one of said portions 41 closing the open end of the slot 33. A through-hole 42 is bored through the plate 39 and an engaging through-hole 43 is bored through the seat plate 40.

A tightening nut 44 has an inserting portion 45 adapted to be rotatably inserted into the through-hole 43 of the extrication lock member 38. The insertion portion 45 has a lower peripheral flange portion 46 engageable with the through-hole 43 to provide the protection against extrication. The inside diameter of the through-hole 43 is selected to be slightly smaller than the outer diameter of the flange portion 46. Thus, after the insertion of the tightening nut 44, the through-hole 43 is so deformed that the nut 44 is entrapped by the extrication lock member 38. A spring washer 47 is placed on the extrication lock plate 39 around the through-hole 42 and is passed through by the screw rod 35 extending upwards through the slot 33. The nut 44 is screwed on the screw rod 35. Another spring washer 47 is passed through by the other screw rod 35 extending through the through-hole 34 of the plate 32, and another tightening nut 44 is screwed on the screw rod 35. A protective cover 48 is set up to enclose the head portion of the device.

The assembly of the cable clamp section is now described. When both nuts 44 are tightened, the bosses 103 of the lower core case 17 are intruded into recesses 104 of the upper core case 20 and the abutting surface 106 of each recess 104 contacts with the abutting surface 105 of the boss 103 as indicated by chain with two dots lines in FIG. 3. Since there is the gap 111 between the lower end of the upper core 28 and the upper end of the lower core 29, the nut 44 can be tightened further by an amount equal to this gap 111. At this time, the surfaces 105 and 106 are pressured to each other to be in close contact and contribute to prevent the permeation of rainwater or fine dust from passing through a possible clearance between these surfaces 105 and 106. The pressuring action contributing to this close contact can be enhanced by a wedge effect since the surfaces 105 and 106 are inclined.

Once the cores 28 and 29 thus come into contact with each other, the holding plate 32 of the upper core case 20 abuts on the upper end of the collar 37 so that the upper core case 20 no longer can be tightened further by means of the tightening nuts 44. In this manner, the excess tightening of the nuts 44 may be avoided and a moderate pressure is always applied on the clamped portion of the cable 120 and between the lower ends of the upper core 28 and the upper ends of the lower core 29.

Figure 1:
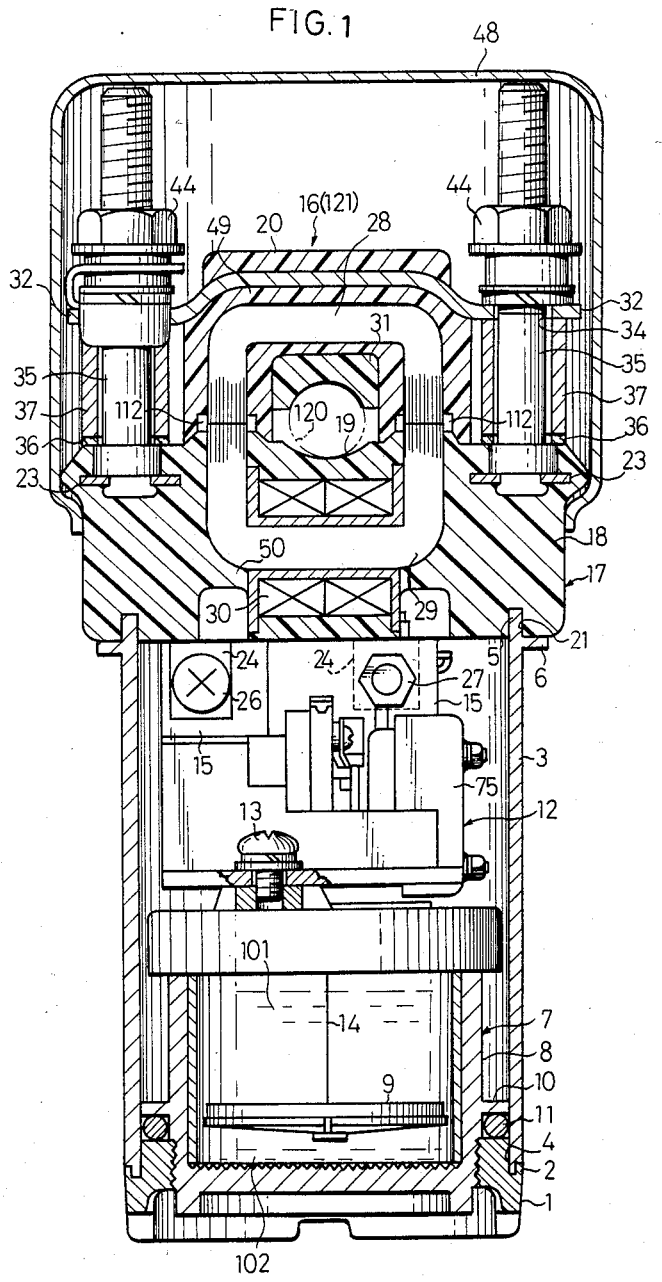
FIG. 1 is a longitudinal sectional view of an overcurrent sensing circuit according to the present invention.

In addition, when the surfaces 105 and 106 are abutting on each other, a space 112 is defined so as to surround the exposed end portions of the upper and lower cores 28 and 29, as shown in FIG. 1. Thus, the silicone oil on cores 28 and 29 may be extruded into and stored in the space 112 when the surfaces 105 and 106 are pressured to each other. Even if any rainwater is intruded occasionally through the interspace between the surfaces 105 and 106, it may be repelled by the silicone oil stored in the space 112 and thus the rusting of the cores 28 and 29 is prevented.

Figure 4:
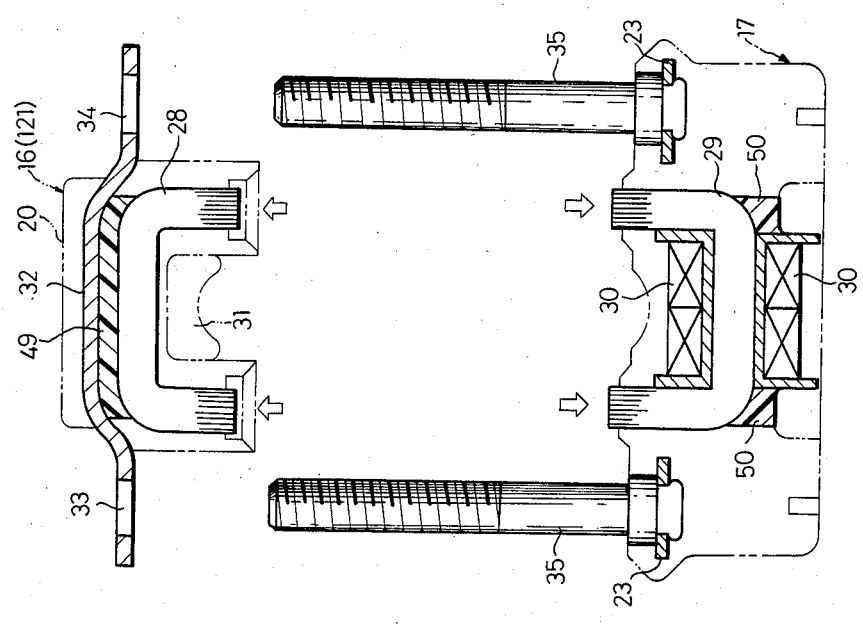
FIG. 4 is an exploded front view of the cable clamp, showing buffer elements mounted within upper and lower core cases of the display device.

In advance to the molding process of the upper core case 20 and the lower core case 17, resilient buffer members 49 and 50 made of the same material as the cases 20 and 17 are respectively placed between the upper surface of the upper inverted U-shaped core 28 and the plate 32, and between both lower corners of the lower U-shaped core 29 and bobbin of the coil 30, as shown in FIG. 4.

Thus, when the upper core 28 and the holding plate 32 are positioned within a fixed metallic mold at the time of molding the upper core case 20, and a movable metallic mold is put together with the fixed mold. The force exerted on both ends of the laminated upper core 28 by the movable mold in the direction of the arrow in FIG. 4 is moderated by the buffer members and any crack formation in both end portions of the upper core 28 can be prevented. Moreover, even in the case where the upper core 28 is forced to slip out of place relative to the holding plate 32, the core 28 is restored to its correct position by the compressing operation of the buffer member 49 and the molding can be carried out appropriately. The situation is similar in the case of molding of the lower core case 17. The proper positioning of the cores 28 and 29 results in the guarantee of the required magnetic properties of the current transformer 121. The buffer members 49 and 50 are of the same material as the upper and lower core cases 20 and 17 and thus may be assimilated to the upper and lower core cases 20 and 17 respectively after the molding.

The overcurrent display device constructed as mentioned above is suspended directly from the cable 120 clamped by the clamp section 16. At this time, the total weight of the drive unit, the display unit and the main casing consisting of the base block 1 and the cover 3 is borne by the lower core case 17 through the base plate 23. However, since the main casing is secured to the drive unit and to the display unit and the cover 3 of the casing member has its upper end inserted engageably from below into the lower core case 17, the weight of the casing member is borne by the drive unit and the display unit and thus the weight of the drive unit and the display unit never falls on the casing member.

In prior-art devices, the drive unit and the display unit, not shown, are secured to the main casing 113, as shown in FIG. 9, and the main casing 113 is secured by bolts 123 to the lower core case 117. Consequently the total weight of the drive unit and the display unit is beared by the main casing 113. On account of this construction, the mechanical strength of the casing member must be increased. On the other hand, in the embodiment of the present invention as shown in FIGS. 1 through 8, it is not necessary to take special precautions about the mechanical strength of the main casing since the weight of the drive unit and the display unit is not borne by the casing member. The weight of the casing member can be reduced and hence the total weight borne by the lower core case 17 can be minimized. Moreover, in prior-art devices, the tightening force of the bolt 123 is exerted directly on the lower core case 117 and yet the total weight of the core case is concentrated and borne at a portion of the lower core case 117 near the head of the bolt 123. The lower core case 117 situated in the main casing 113 is made of a resilient insulating material, such as a rubber and the like, so that the case 117 frequently forms cracks. In the present embodiment, however, the total weight is borne by the base plate 23 embedded in the lower core case 17 and is not exerted locally on a limited part of the lower core case 17 and thus the crack formation in the lower core case 17 or in the main casing can be avoided. The present embodiment contributes to prolong the service life of both the lower core case 17 and the main casing.

In addition, the total weight borne by the base plate 23 embedded in the lower core case 17 is exerted through the screw rods 35 on the holding plate 32 of the upper core case 20, and this plate 32 is sustained through the upper core case 20 by the cable 120. Therefore, any part of the total weight of the drive unit and the display unit together with the main casing is not exerted really on the lower core case 17 to thereby further prolong the service life of the lower core case.

Furthermore, since the rib 5 is formed on a portion of the upper periphery of the cover 3 and is introduced in the groove 21 formed on the lower surface of the lower core case 17, and the lower core case 17 rests on the flange transversely extending from the rib 5 and formed on the upper periphery of the cover 3, the area of the surface supporting the lower core case 17 is increased and the stability in supporting the core case and the associated air-tightness are improved. The flange 6 serves also as a reinforcement rib for the cover 3.

Next, in reference to FIGS. 10 through 13, an overcurrent sensing circuit is described which is adapted to sense an overcurrent flowing in the cable 120 and to operate the drive unit mentioned above. Same numerals are assigned also to members which are used in different embodiments but are the same in operation or construction.

Figure 10:
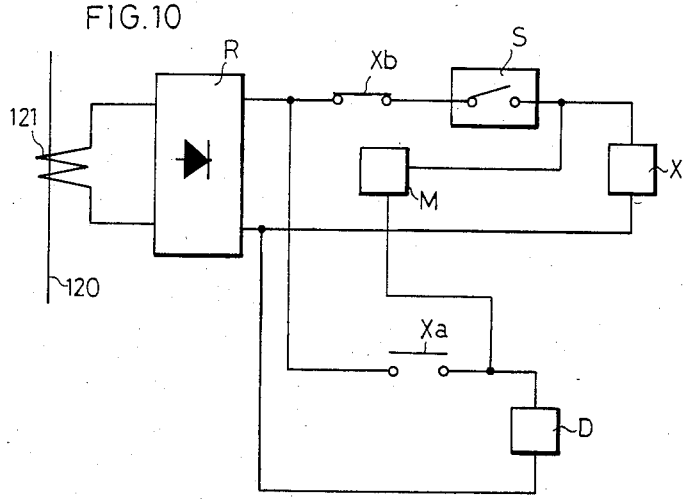
FIG. 10 is a circuit diagram of a basic overcurrent sensing circuit according to the present invention.

In FIG. 10 showing the most basic or rather theoretical circuit construction, a rectifying circuit R is connected to the output termials of the current transformer 121 situated over the cable 120. A switching circuit S and a relay X connected in series are attached to the rectifying circuit R through one of b-contacts Xb (contacts which turn on when the relay X is deenergized ) of the relay X. A self-maintaining circuit M connected to the rectifying circuit R through one of a-contacts Xa (contacts which turn on when the relay X is energized ) and also to the switching circuit S. This circuit M is provided in order to maintain surely the energized state of the relay X after the switching circuit S turns on. The switching circuit S is constructed so that it may be turned on only when a so-called overcurrent flows in the cable 120. A drive element D is connected to the output of the rectifying circuit through one of a-contacts (contacts which turns on when the relay is energized) Xa.

The operation of the aforementioned basic overcurrent sensing circuit is as follows. When a usual load current flows in the cable 120 a small a.c. output voltage occurs in the current transformer 121 and this is rectified by the rectifying circuit R. However, the switching circuit S remains off at this time.

When an overcurrent flows in the cable 120, a d.c. voltage much larger than that of the normal current appears across the output terminals of the rectifying circuit R. At this time the switching circuit S is turned on and the relay X is energized. The contact Xa is closed and the drive element D is energized to exert a pulling force on the string member 14 through the mechanism of the drive unit 12. At the same time the contact Xb is opened and the current flowing in the relay X through the switching circuit S is interrupted. However, a current continues to flow in the relay X from the rectifying circuit R through the one of a-contacts Xa and the self-maintaining circuit M. Thus the energization of the relay X and therefore the actuation of the drive element D continue.

When the overcurrent in the cable 120 disappears, the current through the relay X becomes insufficient to maintain the actuation of the relay X and the contacts Xa and Xb are returned to their deenergized state. The drive element D is restored to its original state as well.

Next a more concrete embodiment of the overcurrent sensing circuit is described which is constructed according to the aforementioned basic construction.

Figure 11:
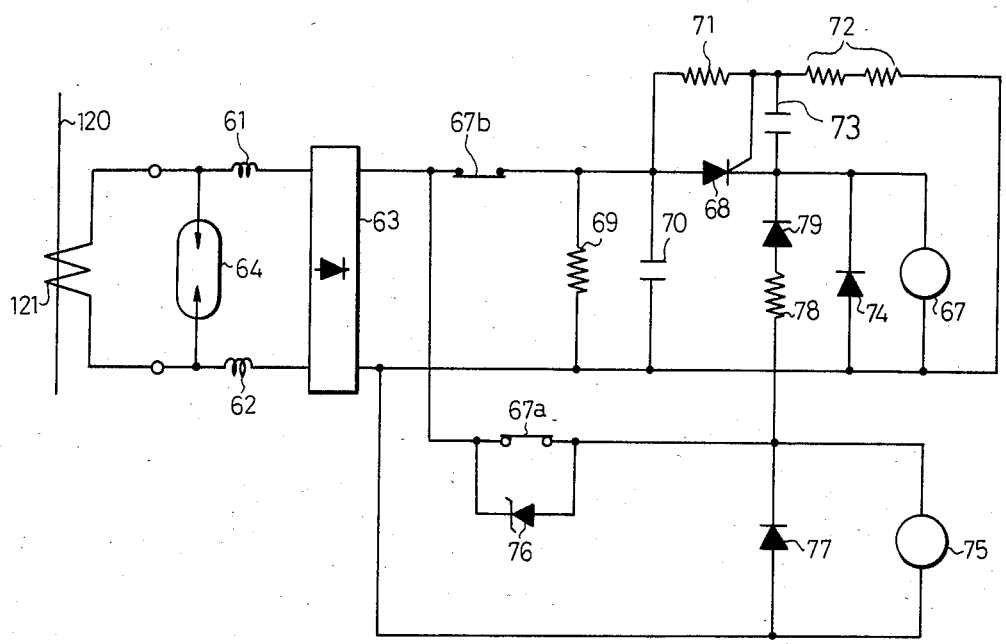
FIG. 11 is a circuit diagram of an embodiment of the overcurrent sensing circuit according to the present invention.

In FIG. 11 a full wave rectifier 63 is connected through choke coils 61 and 62 to the output of the current transformer 121 situated over the cable 120. A surge absorber 64 is connected to the output terminals of the current transformer 121. A relay 67 and a thyristor 68 as a switching element are in series and are connected to the output of the full wave rectifier 63 through one of b-contacts 67b of the relay 67. A voltage setting resistor 69 and a smoothing capacitor 70 for the pulsating output of the full wave rectifier 63 are in parallel and are connected across the anode of the thyristor 68 and the minus terminal of the full wave rectifier 63. Gate voltage setting resistors 71 and 72 are in series and are connected to the anode of the thyristor 68 and the minus terminal of the full wave rectifier 63 and the joint of both resistors is connected to the gate of the thyristor 68. The resistance of the resistor 69 is selected to be much smaller than those of the resistors 71 and 72. A diode 74 is connected in parallel with the relay 67 and is used in order to absorb a surge voltage generated at the instance of the deenergization of the relay 67.

A rotary solenoid 75 as a drive element is connected to the output of the full wave rectifier 63 through one of a-contacts 67a of the relay 67. A zener diode 76 is connected in parallel with the a-contact 67a with the polarity as shown. Also a diode 77 is connected in parallel with the rotary solenoid 75 with the polarity as shown. This diode 77 is used in order to absorb a surge voltage generated at the instance of the deenergization of the rotary solenoid 75.

A resistor 78 and a diode 79 connected in series form another energizing circuit for the relay 67, together with the a-contact 67a and this energizing circuit corresponds to the aforementioned self-maintaining circuit M.

Figure 14:
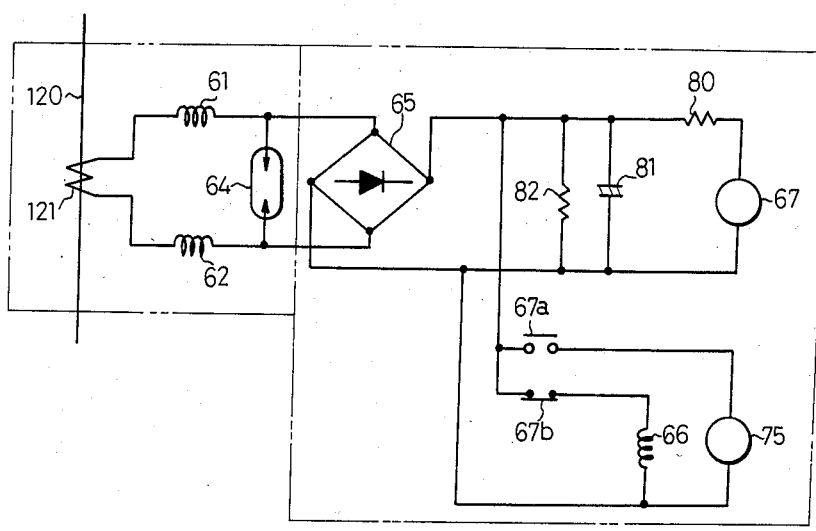
FIG. 14 is a circuit diagram of an overcurrent sensing circuit of a conventional overcurrent display device.

The applicant of the present invention has proposed a circuit as shown in FIG. 14 as an overcurrent sensing circuit other than that of FIG. 11. In the circuit of FIG. 14, the series connection of a protective resistor 80 and a relay 67, a capacitor 81, a resistor 82, the series connection of one of a-contacts 67a of the relay 67 and a rotary solenoid 75 and the series connection of one of b-contacts 67b of the relay 67 and a reactor 66 are all in parallel with one another and are connected to the output terminals of the full wave rectifier 65. The resistances of the resistors 80 and 82 are selected much larger than the impedance of the reactor 66. Consequently, when a load current flows in the cable 120, the output current of the rectifier 65 flows mainly in the reactor 66 and does not come to energize the relay 67.

When an overcurrent flows in the cable, the relay 67 can be energized to operate the contacts 67a and 67b and the rotary solenoid 75 is actuated. However, in this overcurrent sensing circuit, the magnitude of the current branching to the relay 67 is affected by resistors 80 and 82 and the impedance of the reactor 66. Accordingly, there may be a possibility that the relay 67 remains deenergized and the rotary solenoid is not actuated even when an overcurrent is brought about in the cable 120. In order to eliminate this unreliability and to operate the rotary solenoid 75 without fail, it is necessary to use a current transformer of excessively large capacity. In view of these points, the applicant has devised the improved circuit as shown in FIG. 11.

Now the operation of the overcurrent sensing circuit of FIG. 11 is described. When a load current flows in the cable 120 the current transformer provides a low a.c. output, which is rectified by the rectifier 63. The output of the rectifier 63 is dissipated substantially as the joule's heat in the resistor 69. At this time the anode voltage and the gate voltage applied to the tyristor 68 are insufficient to turn on the thyristor 68, which thus remains off. When an overcurrent flows in the cable 120, a much larger output is obtained in the current transformer 121 and the output is rectified by the rectifier 63. The output current of the rectifier 63 flows in the resistors 71 and 72 through the b-contact 67b and charges the capacitor 70. In the presence of an overcurrent, the output of the rectifier is correspondingly large and the anode voltage and the gate voltage of the thyristor 68 are sufficiently large to turn on the thyristor 68. Thus the relay 67 is energized, the contact 67a begins to close and the contact 67b begins to open.

In this case, it takes an operation time of 10 to 20 ms from the beginning of the opening of the contact 67b to the complete closing of the contact 67a. In this duration both contacts remain open and a high voltage is generated across the output terminals of the rectifier 63. The zener diode 76 then breaks down to be conductive. Thus the rotary solenoid 75 is actuated and an energizing current flows to the relay 67 through the zener diode 76, the resistor 78 and the diode 79. After the a-contact 67a is closed completely, the zener diode 76 becomes again off and the major part of the current flowing in this contact goes to the solenoid 75, which can operate now satisfactorily. On the other hand a small part of the current in the a-contact 67a goes to the relay 67 through the resistor 78 and the diode 79. Even after the initial energizing circuit for the relay 67 is broken as a result of the complete opening of the b-contact 67b, the relay is continuously energized through the a-contact 67a. In this manner, the closure of the contact 67a is self-maintained. An additional charge to the capacitor 70 and the power dissipation in the resistor 69 are prevented because the b-contact 67b is opened. A discharge current flows, however, to the relay 67 from the capacitor 70 through the thyristor 68 as long as the voltage across the capacitor 70 is not less than a certain lower limit. In this case the gate current for the thyristor 68 is supplied from the capacitors 70 and 73.

When the overcurrent in the cable, the current in the relay 67 vanishes, the a-contact 67a is opened and the b-contact 67b is closed. As the result of this, the actuation of the rotary solenoid 75 is released as well and the rotary solenoid is restored to its original situation.

In this overcurrent sensing circuit as is described above, the small output of the rectifier 63 due to a load current in the cable 120 is absorbed substantially in the resistor 69 and does not influence the relay 67. when the thyristor 68 is turned on due to the overcurrent in the cable and the relay 67 is turned to the self-maintaining state, the major part of the output current of the rectifier 63 is used to actuate the rotary solenoid 75 except for a small amount which is required for actuating the relay 67 by passing through the a-contact 67a, the resistor 78 and the diode 79. The reliability of the operation of the rotary solenoid 75 is therby much increased.

On the other hand, while the a-contact 67a and the b-contact 67b are both opened transiently, the breakdown of the zener diode 76 makes the energization of the rotary solenoid possible, so that the response of the sensing circuit to the overcurrent is much improved. Furthermore, the relay 67 is kept in the self-maintaining state following the actuation of the thyristor 68 and so the rotary solenoid 75 can be actuated only if the output voltage of the rectifier 63 exceeds slightly the predetermined threshold necessary for the actuation of the thyristor.

Figure 12:
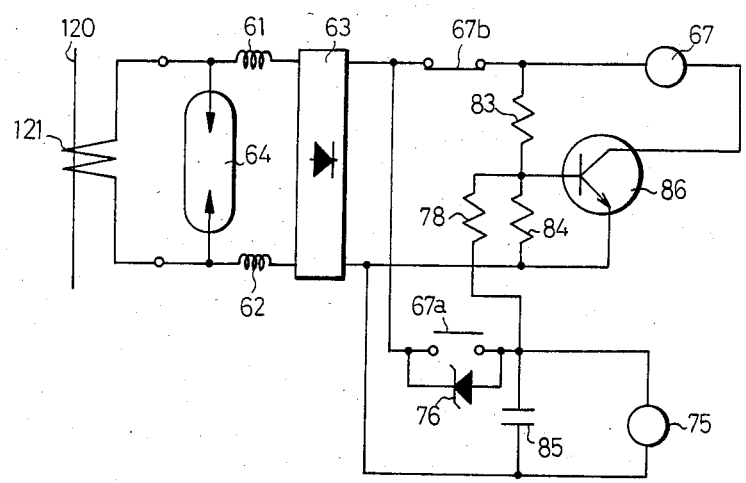
FIG. 12 is a circuit diagram of another embodiment of the overcurrent sensing circuit according to the present invention.
Figure 13:
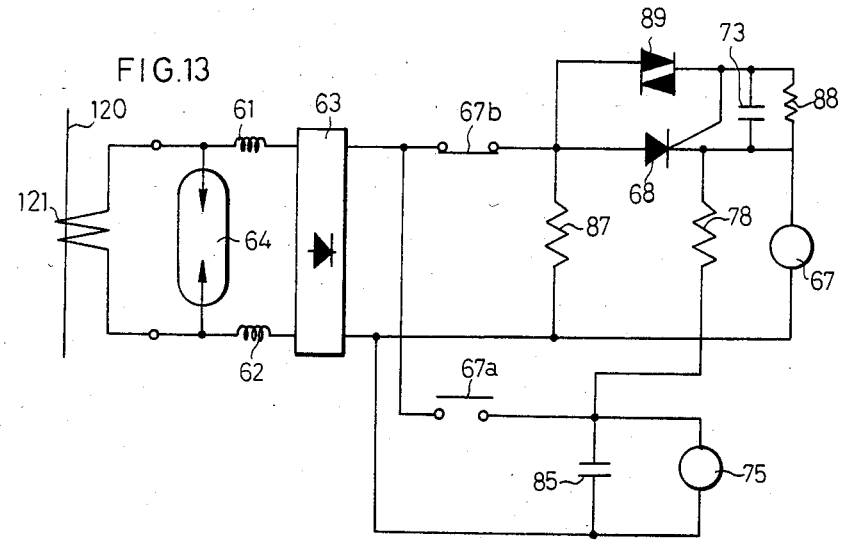
FIG. 13 is a circuit diagram of still another embodiment of the overcurrent sensing circuit according to the present invention.

Next, different embodiments of the overcurrent sensing circuit are described in reference to FIGS. 12 and 13. These embodiments are different mainly in the construction of the switching circuit from each other and from that in FIG. 11.

In FIG. 12, resistors 83 and 84 are in series and are connected to the output terminals of the rectifier 63. A surge absorbing capacitor 85 is in parallel with the rotary solenoid 75. The base of an emitter-grounded transistor 86 is connected to the joint point of the resistors 83 and 84 and the collector of it is connected to the plus terminal of the rectifier 63 through the relay and the b-contact 67b. The transistor 86 constitutes the switching circuit, and the resistors 78, 83 constitute the self-maintaining circuit. When a load current flows in the cable 120, the voltage applied to the base and the collector of the transistor 86 is insufficient to turn on the transistor 86. When an overcurrent flows in the cable 120, the transistor 86 is turned on and the relay 67 is energized. The rotary solenoid 75 is actuated through the a-contact 67a. Even after the b-contact 67b is opened, the energization of the relay 67 is self-maintained.

In FIG. 13, a trigger diode 89 and a resistor 88 are situated parallel to a thyristor 68. The gate of the thyristor 68 is connected to the joint point between the trigger diode 89 and the resistor 88. The thyristor 68 substantially constitutes the switching circuit, and the resistor 78 substantially constitues the self-maintaining circuit. When a load current flows in the cable 120, the trigger diode 89 is insulating, the voltage across the resistor 88 is zero and the thyristor remains off. The current from the rectifier 63 is consumed by the resistor 87. When an overcurrent flows in the cable 120, a higher output voltage of the rectifier 63 makes the trigger diode conductive. The voltage appearing across the resistor 88 triggers the thyristor.

Even after the current through the thyristor 68 is interrupted by the b-contact 67b, the condition of the relay 67 is self-maintained by the current through the a-contact 67a and the resistor 78.

As is apparent from the foregoing description, the overcurrent display device can be used with interchangeability for those current transformers of various output properties which are mounted on many distribution cables. The device operates also reliably because the electric power due to an overcurrent can be used effectively and almost exclusively for actuating the drive element.

Since it is evident that broadly different embodiments can be conceived within the spirit and the scope of the present invention, the invention is not limited to any specific embodiment thereof except as defined in the appended claims.

What is claimed is:

1. An overcurrent display device comprising:
an overcurrent sensing circuit adapted to sense an overcurrent in a cable and to provide electric power due to the sensed overcurrent, said overcurrent sensing circuit including an overcurrent sensing current transformer to be placed around the cable and having outputs, a rectifying circuit connected to the outputs of the current transformer and having at least two outputs, a switching circuit adapted to permit electricity to pass therethrough only when a voltage at the outputs of the rectifying circuits is above a predetermined value, relay means including a main relay, a-contacts and b-contacts, said a-contacts being closed only when the main relay is energized, and said b-contacts being opened only when the main relay is energized, said main relay, switching circuit and one of the b-contacts being arranged in series and connected to the outputs of the rectifying circuit so that electricity temporarily passes therethrough only when a voltage at the outputs of the rectifying circuit is above a predetermined value, a zener diode connected parallel to the one of the a-contacts, and self-maintaining circuit connected at one end to a line between the b-contact and one of the outputs of the rectifying circuit through the one of the a-contacts and at the other end to a line between the main relay and the switching circuit so that after the b-contact opens due to the overcurrent, electricity is supplied to the main relay through the a-contact and the self-maintaining circuit,
a drive unit including a drive element, said drive element being connected to the one of the a-contacts at one end and to a line between the main relay and the output of the rectifying circuit at the other end so that when the a-contact is closed, due to the overcurrent, the drive element operates, and
a display unit including a display tube, the inside of the tube being visible at least from below, a fluid stored in said tube and a display element situated in said tube and operationally connected to said drive element, an overcurrent condition being displayed as the result of actuation of said display element operated by said drive element, and a normal condition being displayed by said display element situated at a lower position under the influence of own gravity thereof and the viscosity of said fluid in a predetermined time.

2. An overcurrent display device according to claim 1, wherein said switching circuit includes a thyristor adapted to be triggered by the voltage applied between its anode and cathode.

3. An overcurrent display device according to claim 1, wherein a capacitor is connected in parallel with the series connection of said switching circuit and said main relay for temporarily supplying voltage on said switching circuit after the break of said b-contact.

4. An overcurrent display device comprising:
an overcurrent sensing circuit adapted to sense an overcurrent in a cable and to provide electric power due to the sensed overcurrent, said overcurrent sensing circuit including an overcurrent sensing current transformer to be placed around the cable and having outputs, a rectifying circuit connected to the outputs of the current transformer and having at least two outputs, a switching circuit adapted to permit electricity to pass therethrough only when a voltage at the outputs of the rectifying circuits is above a predetermined value, said switching circuit including a thyristor adapted to be triggered by the voltage applied between its anode and cathode, relay means including a main relay, a-contacts and b-contacts, said a-contacts being closed only when the main relay is energized, and said b-contacts being opened only when the main relay is energized, said main relay, switching circuit and one of the b-contacts being arranged in series and connected to the outputs of the rectifying circuit so that electricity temporarily passes therethrough only when a voltage at the outputs of the rectifying circuit is above a predetermined value, and self-maintaining circuit connected at one end to a line between the b-contact and one of the outputs of the rectifying circuit through the one of the a-contacts and at the other end to a line between the main relay and the switching circuit so that after the b-contact opens due to the overcurrent, electricity is supplied to the main relay through the a-contact and the selfmaintaining circuit, said self-maintaining circuit including a diode and a resistor connected in series for providing the gate current of said thyristor,
a drive unit including a drive element, said drive element being connected to the one of the a-contacts at one end and to a line between the main relay and the output of the rectifying circuit at the other end so that when the a-contact is closed, due to the overcurrent, the drive element operates, and
a display unit including a display tube, the inside of the tube being visible at least from below, a fluid stored in said tube and a display element situated in said tube and operationally connected to said drive element, an overcurrent condition being displayed as the result of actuation of said display element operated by said drive element, and a normal condition being displayed by said display element situated at a lower position under the influence of own gravity thereof and the viscosity of said fluid in a predetermined time.

5. An overcurrent display device according to claim 4, wherein a capacitor is connected in parallel with the series connection of said switching circuit and said main relay for temporarily supplying voltage on said switching circuit after the break of said b-contact.

6. An overcurrent display device according to claim 5, wherein a zener diode is connected parallel to the one of the a-contacts.

7. An overcurrent display device comprising,
an overcurrent sensing circuit adapted to sense an overcurrent in a cable and to provide electric power due to the sensed overcurrent, said overcurrent sensing circuit including an overcurrent sensing current transformer to be placed around the cable and having outputs, a rectifying circuit connected to the outputs of the current transformer and having at least two outputs, a switching circuit adapted to permit electricity to pass therethrough only when a voltage at the outputs of the rectifying circuits is above a predetermined value, relay means including a main relay, a-contacts and b-contacts, said a-contacts being closed only when the main relay is energized and said b-contacts being opened only when the main relay is energized, said main relay, switching circuit and one of the b-contacts being arranged in series and connected to the outputs of the rectifying circuit so that electricity temporarily passes therethrough only when a voltage at the outputs of the rectifying circuit is above a predetermined value, and a self-maintaining circuit connected at one end to a line between the b-contact and one of the outputs of the rectifying circuit through the one of the a-contacts and at the other end to a line between the main relay and the switching circuit so that after the b-contact opens due to the overcurrent, electricity is supplied to the main relay through the a-contact and the self-maintaining circuit, a cable clamp section including a lower core case made of a resilient insulating material and having a lower core embedded therein and a groove formed on a lower surface thereof, an upper core case made of a resilient insulating material and having an upper core embedded therein, said both core cases being adapted to clamp the cable therebetween, said current transformer including said upper and lower cores in said cable clamp section and a coil wound around said lower core, and a base plate with a mounting portion embedded in said lower core case and extending downwards from said lower core case, a drive unit secured to said mounting portion of the base plate and including a drive element, said drive element being connected to the one of the a-contacts at one end and to a line between the main relay and the output of the rectifying circuit at the other end so that when the a-contact is closed, due to the overcurrent, the drive element operates, and a display unit secured to a lower portion of said drive unit and including a display tube, the inside of the tube being visible at least from below, a fluid stored in said tube, a display element situated in said tube and operationally connected to said drive element in a vertical direction in said fluid, an overcurrent condition being displayed as the result of actuation of said display element operated by said drive element and a normal condition being displayed by said display element situated at a lower position under the influence of own gravity thereof and the viscosity of said fluid in a predetermined time, and a main casing encircling said drive and display units and secured at the lower end thereof to the display unit, said main casing having a base block threadedly attached to said display unit and a tubular cover mounted on said base block, said cover having an upper peripheral rib engaging the groove formed on the lower surface of said lower core case.

8. An overcurrent display device according to claim 7, wherein said tubular cover of said main casing further includes a rotation lock projection formed on said upper rib, and said groove of the lower core case further includes a rotation lock recess, said rotation lock projection engaging said rotation lock recess.

9. An overcurrent display device according to claim 7, wherein said tubular cover of said main casing further includes a flange extending radially outwardly from said upper rib, the lower surface of said lower core case resting on said flange.

10. An overcurrent display device comprising, an overcurrent sensing circuit adapted to sense an overcurrent in a cable and to provide electric power due to the sensed overcurrent, said overcurrent sensing circuit including an overcurrent sensing current transformer to be placed around the cable and having outputs, a rectifying circuit connected to the outputs of the current transformer and having at least two outputs, a switching circuit adapted to permit electricity to pass therethrough only when a voltage at the outputs of the rectifying circuits is above a predetermined value, relay means including a main relay, a-contacts and b-contacts, said a-contacts being closed only when the main relay is energized and said b-contacts being opened only when the main relay is energized, said main relay, switching circuit and one of the b-contacts being arranged in series and connected to the outputs of the rectifying circuit so that electricity temporarily passes therethrough only when a voltage at the outputs of the rectifying circuit is above a predetermined value, and a self-maintaining circuit connected at one end to a line between the b-contact and one of the outputs of the rectifying circuit through the one of the a-contacts and at the other end to a line between the main relay and the switching circuit so that after the b-contact opens due to the overcurrent, electricity is supplied to the main relay through the a-contact and the self-maintaining circuit, a cable clamp section including a lower core case made of a resilient insulating material and having a lower core embedded therein, an upper core case made of a resilient insulating material and having an upper core embedded therein, said both core cases being adapted to clamp the cable therebetween, said current transformer including said upper and lower cores in said cable clamp section and a coil wound around said lower core, a base plate with a mounting portion embedded in said lower core case and extending downwards from said lower core case, a pair of screw rods secured at lower ends thereof to the base plate and extending upwardly from the lower core, a holding plate embedded in said upper core case and having insertion openings on two exposed ends thereof, and tightening nuts engaging said screw rods so that the base plate is connected to the holding plate by means of the nuts and screw rods passing through the insertion openings of the holding plate, a drive unit including a drive element, said drive element being connected to the one of the a-contacts at one end and to a line between the main relay and the output of the rectifying circuit at the other end so that when the a-contact is closed, due to the overcurrent, the drive element operates, and a display unit including a display tube, the inside of the tube being visible at least from below, a fluid stored in said tube, a display element situated in said tube and operationally connected to said drive element in a vertical direction in said fluid, an overcurrent condition being displayed as the result of actuation of said display element operated by said drive element, and a normal condition being displayed by said display element situated at a lower position under the influence of own gravity thereof and the viscosity of said fluid in a predetermined time, said drive unit and display unit being secured to said mounting portion of said base plate, and a main casing being secured to and encircling said drive and display units.

11. An overcurrent display device comprising, an overcurrent sensing circuit adapted to sense an overcurrent in a cable and to provide electric power due to the sensed overcurrent, said overcurrent sensing circuit including an overcurrent sensing current transformer to be placed around the cable and having outputs, a rectifying circuit connected to the outputs of the current transformer and having at least two outputs, a switching circuit adapted to permit electricity to pass therethrough only when a voltage at the outputs of the rectifying circuits is above a predetermined value, relay means including a main relay, a-contacts and b-contacts, said a-contacts being closed only when the main relay is energized and said b-contacts being opened only when the main relay is energized, said main relay, switching circuit and one of the b-contacts being arranged in series and connected to the outputs of the rectifying circuit so that electricity temporarily passes therethrough only when a voltage at the outputs of the rectifying circuit is above a predetermined value, and a self-maintaining circuit connected at one end to a line between the b-contact and one of the outputs of the rectifying circuit through the one of the a-contacts and at the other end to a line between the main relay and the switching circuit so that after the b-contact opens due to the overcurrent, electricity is supplied to the main relay through the a-contact and the self-maintaining circuit, a cable clamp section including a lower core case made of a resilient insulating material and having a lower core embedded therein, said lower core being in the form of a U shape and having its upper extreme ends exposed from an upper surface of said lower core case to form annular abutting surfaces therearound, and upper core case made of a resilient insulating material and having an upper core embedded therein, said upper core being in the form of an inverted U shape and having its lower extreme ends exposed from a lower surface of said upper core case to form annular abutting surfaces therearound, said both core cases being adapted to clamp the cable therebetween, said current transformer including said upper and lower cores in said cable clamp section and a coil wound around said lower core, a base plate with a mounting portion embedded in said lower core case and extending downwards from said lower core case, an interspace defined between the lower extreme ends of said upper core and the upper extreme ends of said lower core when the respective abutting surfaces abut on each other, said interspace being then reduced to zero upon strongly tightening said upper and lower cores, a drive unit including a drive element, said drive element being connected to the one of the a-contacts at one end and to a line between the main relay and the output of the rectifying circuit at the other end so that when the a-contact is closed, due to the overcurrent, the drive element operates, and a display unit including a display tube, the inside of the tube being visible at least from below, a fluid stored in said tube, a display element situated in said tube and operationally connected to said drive element in a vertical direction in said fluid, an overcurrent condition being displayed as the result of actuation of said display element operated by said drive element, and a normal condition being displayed by said display element situated at a lower position under the influence of own gravity thereof and the viscosity of said fluid in a predetermined time, said drive unit and display unit being secured to said mounting portion of said base plate, and a main casing being secured to and encircling said drive and display units.

12. An overcurrent display device according to claim 11, wherein said cable clamp section further includes recesses defined around the exposed extreme ends of said upper core, and corresponding bosses defined around the extreme end portions of said lower core for mating with said recesses, said abutting surfaces inclining and extending from the inner periphery of said recesses to the outer periphery of said bosses.

13. An over current display device according to claim 11, wherein a space designed for storage of oil is defined around the exposed end portions of said upper and lower cores when they abut against each other, said end portions of said upper and lower cores being disposed within said space, and a recess is formed around at least one of said end portions.

14. An overcurrent display device according to claim 11, wherein buffer members are interposed between the upper end surface of said upper core and an insert member to be embedded in said upper core case and between the lower end surface of said lower core case and an insert member to be embedded in said lower core case.

* * * * *